(12) United States Patent
Zahir et al.

(10) Patent No.: US 11,533,044 B2
(45) Date of Patent: Dec. 20, 2022

(54) HIGH VOLTAGE MULTI-SIGNALING OUTPUT DRIVER APPARATUS

(71) Applicant: Samsung Electronics Co., Ltd., Suwon-si (KR)

(72) Inventors: Zaira Zahir, Srinagar (IN); Saurabh Saxena, Jaipur (IN); Ankush Chowdhury, Bengaluru (IN)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/400,583

(22) Filed: Aug. 12, 2021

(65) Prior Publication Data
US 2022/0216857 A1 Jul. 7, 2022

(30) Foreign Application Priority Data

Jan. 7, 2021 (IN) .............................. 202141000650

(51) Int. Cl.
| | | |
|---|---|---|
| H03K 3/00 | (2006.01) | |
| H03K 17/284 | (2006.01) | |
| H02M 1/08 | (2006.01) | |
| G05F 1/56 | (2006.01) | |
| H03K 3/012 | (2006.01) | |
| H03K 17/687 | (2006.01) | |

(52) U.S. Cl.
CPC ......... *H03K 3/012* (2013.01); *H03K 17/6872* (2013.01)

(58) Field of Classification Search
USPC ....................................................... 326/59, 60
See application file for complete search history.

(56) References Cited

U.S. PATENT DOCUMENTS 4,408,135 A * 10/1983 Yuyama ................. H03K 5/023
  326/60
7,068,075 B2 * 6/2006 Lim .................... H03K 19/0013
  326/80

* cited by examiner

*Primary Examiner* — Kenneth B Wells
(74) *Attorney, Agent, or Firm* — Harness, Dickey & Pierce, P.L.C.

(57) ABSTRACT

An apparatus for generating multi-signaling output voltage may include at least one output buffer, wherein the at least one the output buffer may include a first PMOS transistor, a second PMOS transistor, a first NMOS transistor, a second NMOS transistor, and a Zener diode along with a switchable current source. The apparatus may further include first logic circuitry, second logic circuitry, first voltage down level shifter circuitry, second voltage down level shifter circuitry, and a first voltage up level shifter circuitry. Outputs of the first voltage down level shifter circuitry, the second voltage down level shifter circuitry, and the first voltage up level shifter circuitry are combined using the output buffer to generate the desired output. The second NMOS transistor acts as isolation transistor for reducing and/or preventing diode current between a first supply voltage and the third supply voltage.

20 Claims, 5 Drawing Sheets

HIGH VOLTAGE MULTI-SIGNALING OUTPUT DRIVER APPARATUS

CROSS-REFERENCE TO RELATED APPLICATIONS

This application claims the benefit of priority under 35 U.S.C. § 119, to Indian Patent Application No. 202141000650, filed on Jan. 7, 2021 in the Indian Intellectual Property Office, the disclosure of which is incorporated herein by reference in its entirety.

FIELD

Various example embodiments of the inventive concepts relate to output voltage drivers, high voltage multi-signaling output driver apparatuses including the output voltage drivers, and/or methods of operating the output voltage drivers and/or high voltage multi-signaling output driver apparatuses.

BACKGROUND

An area efficient high voltage driver having three output voltage levels (e.g., 20V, 0, -20V) is difficult to design without using and/or consuming any forward body-diodes and/or any crowbar current. Forward biasing of body-diode of the transistors leads to latch up issues, thereby damaging the integrated circuit chip. The flow of any crowbar current between high voltage supplies in high voltage level drivers leads to a significant increase in the current consumption of the chip, thereby increasing the energy consumption of the circuit, and also leads to Electro migration (EM) failures within the circuit.

The use of thick gate oxide CMOS transistors supporting gate-to-source voltages (VGS) greater than 20 Volts (V) would significantly increase the area and hence increase the cost of the chip. Laterally-diffused metal-oxide semiconductor (LDMOS) transistors may be used and support |VGS|, and |VGB| less than 6 V, but require larger drain-to-source voltages (VDS) and occupy less area as compared to thick gate-oxide transistors. Apart from the required architectural modification to support VGS less than 6V, generating multiple voltage output levels (e.g., more than two voltage levels) by using pull up/pull down transistors from a separate supply, at the output using the same LDMOS transistors can potentially forward bias the body diodes of the transistors. This can cause latch up and hence damage the chip.

Thus, there is a need to provide an area efficient high voltage driver having three high voltage output levels (e.g. 20V, 0, -20V) without using and/or consuming any forward body-diode and/or any crowbar current.

SUMMARY

Various example embodiments of the inventive concepts provide for an apparatus for driving and/or operating multi-signaling output voltage. The apparatus provides an area efficient high voltage driver having three high voltage output levels (e.g., 20V, 0, -20V) without using and/or consuming any forward body-diode and/or reducing and/or eliminating the use and/or consumption of any crowbar current.

Additionally, at least one example embodiment provides isolation between different pull-up paths such that a forward biasing of body diodes is reduced, decreased, and/or completely avoided.

Accordingly, at least one example embodiment provides an apparatus for generating a multi-signaling output voltage comprising at least one output buffer. The at least one output buffer comprises a plurality of p-type metal-oxide-semiconductor (PMOS) transistors, each PMOS transistor of the plurality of PMOS transistors including a source, a drain and a gate, and a plurality of n-type metal-oxide-semiconductor (NMOS) transistors, each NMOS transistor of the plurality of NMOS transistors including a source, a drain and a gate, a first PMOS transistor from the plurality of PMOS transistors, the drain of the first PMOS transistor being connected to a drain of a first NMOS transistor from the plurality of NMOS transistors, a second NMOS transistor from the plurality of NMOS transistors, the source of the second NMOS transistor being connected to the drain of the first NMOS transistor and the drain of the first PMOS transistor, a second PMOS transistor from the plurality of PMOS transistors, the source of the second PMOS transistor (MP1) being connected to a third supply voltage, and the drain of the second PMOS transistor being connected to the drain of the second NMOS transistor, and a reversed Zener diode including a positive terminal and a negative terminal, the negative terminal being connected to the gate of the second NMOS transistor and a third supply voltage through a switchable current source, the positive terminal being connected to the source of the second NMOS transistor, the drain of the first PMOS transistor, and the drain of the first NMOS transistor.

In at least one example embodiment, the at least one output voltage is configured to output a first supply voltage, in response to the first NMOS transistor and the second PMOS transistor being in a non-operating state, and the second NMOS transistor and the first PMOS transistor being in an operating state, output a second supply voltage, in response to the first PMOS transistor and the second PMOS transistor being in the non-operating state, and the first NMOS transistor and the second NMOS transistor being in the operating state, and output the third supply voltage, in response to the second NMOS transistor, the first PMOS transistor, and the first NMOS transistor being in the non-operating state, and the second PMOS transistor being in the operating state.

In at least one example embodiment, the apparatus further comprises first logic circuitry, second logic circuitry, first voltage down level shifter circuitry, second voltage down level shifter circuitry, and first voltage up level shifter circuitry.

In at least one example embodiment, the first logic circuitry is configured to provide an input signal to the first voltage down level shifter circuitry, and provide an input signal to the second voltage down level shifter circuitry, and the second logic circuitry is configured to provide input signal to the first voltage up level shifter circuitry.

In at least one example embodiment, the first logic circuitry is configured to introduce an edge dependent skew between an input to the first voltage down level shifter circuitry and an input to the second voltage down level shifter circuitry such that there is no crowbar current between a first supply voltage and a second supply voltage.

In yet at least one example embodiment, the first voltage down level shifter circuitry is configured to provide an input signal to the gate of the first PMOS transistor, the second voltage down level shifter circuitry is configured to provide an input signal to the gate of the first NMOS transistor, and the first voltage up level shifter circuitry is configured to provide an input signal to the gate of the second PMOS transistor.

In at least one example embodiment, for each transistor of the plurality of PMOS transistors and the plurality of NMOS transistors, a bulk and the source are connected.

In at least one example embodiment, the second NMOS transistor is configured to act as isolation transistor to reduce current flow between a first supply voltage and the third supply voltage.

The plurality of PMOS transistors and the plurality of NMOS transistors are thin oxide laterally-diffused metal-oxide semiconductor (LDMOS) transistors.

Accordingly, at least one example embodiment herein provides a method for generating a multi-signaling output voltage. The method includes setting an output voltage of at least one output buffer included in an apparatus to a first supply voltage, in response to a first NMOS transistor of a plurality of NMOS transistors of the apparatus and a second PMOS transistor of a plurality of PMOS transistors of the apparatus being in a non-operating state, and a second NMOS transistor of the plurality of NMOS transistors and a first PMOS transistor of the plurality of PMOS transistors being in an operating state, setting the output voltage to a second supply voltage, in response to the first PMOS transistor and the second PMOS transistor being in the non-operating state, and the first NMOS transistor and the second NMOS transistor being in the operating state, and setting the output voltage to a third supply voltage, in response to the second NMOS transistor, the first PMOS transistor and the first NMOS transistor being in the non-operating state, and the second PMOS transistor being in the operating state.

In at least one example embodiment, the method further includes reducing current flow between the first supply voltage and the third supply voltage using the second NMOS transistor, wherein the second NMOS transistor acts as an isolation transistor.

In at least one example embodiment, the method further includes generating a first reference voltage based on the first supply voltage using a reverse biased Zener diode, and providing the first reference voltage to a first voltage down level shifter circuitry.

In at least one example embodiment, the method further includes generating a second reference voltage based on the second supply voltage using a reverse biased Zener diode, and providing the second reference voltage to the second voltage down level shifter circuitry.

In at least one example embodiment, the method further includes generating a third reference voltage based on the second supply voltage, generating an N level output voltage using the at least one output buffer, wherein N is a natural number, and providing isolation between different pull-up paths using the second NMOS transistor.

These and other aspects of the example embodiments herein will be better appreciated and understood when considered in conjunction with the following description and the accompanying drawings. It should be understood, however, that the following descriptions, while discussing some example embodiments and numerous specific details thereof, are given by way of illustration and not of limitation. Many changes and modifications may be made within the scope of the example embodiments of the inventive concepts herein without departing from the spirit thereof, and a person of ordinary skill in the art may recognize that the example embodiments may be modified to include such modifications.

BRIEF DESCRIPTION OF THE FIGURES

Various example embodiments are illustrated in the accompanying drawings, throughout which like reference letters indicate corresponding parts in the various figures. The example embodiments herein will be better understood from the following description with reference to the drawings, in which.

DETAILED DESCRIPTION

Various example embodiments herein and the various features and advantageous details thereof are explained more fully with reference to the non-limiting example embodiments that are illustrated in the accompanying drawings and detailed in the following description. Descriptions of well-known components and processing techniques are omitted so as to not unnecessarily obscure the example embodiments herein. Also, the various some example embodiments described herein are not necessarily mutually exclusive, as some example embodiments can be combined with one or more other example embodiments to form new example embodiments. The term "or" as used herein, refers to a non-exclusive or, unless otherwise indicated. The examples used herein are intended merely to facilitate an understanding of ways in which the example embodiments herein can be practiced and to further enable those skilled in the art to practice the example embodiments herein. Accordingly, the examples should not be construed as limiting the scope of the example embodiments herein.

As is traditional in the field, various example embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware. The circuits may, for example, be embodied in one or more semiconductor chips, or on substrate supports such as printed circuit boards. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the some example embodiments may be physically separated into two or more interacting and discrete blocks without departing from the scope of the inventive concepts. Likewise, the blocks of the example embodiments may be physically combined into more complex blocks without departing from the scope of the inventive concepts.

For quick reference of the example embodiments, the following reference glossary is provided:
1. CLK_IN refers to a low voltage clock input to a first logic block,
2. CLK_NMOS refers to an input to a second down level shifter,
3. CLK_PMOS refers to an input to a first down level shifter,
4. CLK_PMOS_LS refers to an input to a gate of a first PMOS transistor,
5. CLK_NMOS_LS refers to an input to a gate of a first NMOS transistor,
6. CLK2_PMOS refers to an input to a first up level shifter,
7. CLK2_PMOS_LS refers to an input to a gate of the second PMOS transistor
8. GND refers to ground,
9. HI_IMP refers to an low voltage input signal to the first logic block,
10. HI_IMP2 refers to a low voltage input signal to a second logic block,
11. HV_PREOUT refers to the intermediate output node present at the source of second NMOS transistor,
12. HVOUT refers to an output voltage of the at least one output buffer,
13. LDMOS refers to a laterally-diffused metal-oxide semiconductor,
14. NMOS refers to a N-type metal-oxide-semiconductor,
15. PMOS refers to an P-type metal-oxide-semiconductor,
16. VDDL refers to a second reference voltage,
17. VDDH1 refers to a first supply voltage,
18. VDDH2 refers to a third supply voltage,
19. VSSL refers to a second supply voltage,
20. VSSL1 refers to a first reference voltage, and
21. VSSL2 refers to a third reference voltage.

Accordingly, various example embodiments herein provide apparatuses for driving and/or generating high voltage multi-signalling output. The apparatus comprises a set (e.g., plurality of) of logic blocks, a set of level shifters and/or an output driver, etc., but the example embodiments are not limited thereto. At least one example embodiment uses LDMOS transistors which support |VGS|, |VGB| less than 6V, but larger and/or much larger than |VDS|. The VDS supported depends upon and/or is based on the type of LDMOS. Some LDMOS support a VDS of 20 V, some LDMOS support a VDS of 40 V, and so on, but the example embodiments are not limited thereto. The driver is designed for at least three desired output voltages of, for example, −20V, 0V and 20 V, but can be extended to much higher voltages by the use of appropriate types of LDMOS transistors. However, the driver is not limited to those output voltage levels, and may also support greater than three output voltage levels. The source and bulk of these LDMOS transistors are shorted, thereby ensuring and/or increasing reliability. Generation of two levels is performed using laterally-diffused (LD) PMOS and LD NMOS transistors in an inverter-type configuration, without the flow of body diode currents and/or with a reduced flow of body diode currents, etc. The gate voltage of these transistors is defined using the proposed architectural design modifications (e.g., the use of level shifters and internally generated supplies for pre-driver circuit, etc.), such that the VGS of the transistors is always less than a desired voltage, such as 6 V, but is not limited thereto.

Unlike a conventional two level voltage driver, the voltage driver of at least one example embodiment provides three different desired levels of output (e.g., 20V, 0, −20V) without using and/or consuming any forward body-diode and/or without using and/or consuming any crowbar current using thin gate oxide LDMOS transistors. An isolation is provided between different pull-up paths such that the forward biasing of body diodes is reduced and/or completely avoided. At least one example embodiment of the apparatus is further extended to generate n different levels and provides a low cost solution for making a high voltage multi-signal output driver.

Referring now to the drawings, and more particularly to FIGS. 1-5 where similar reference characters denote corresponding features consistently throughout the figures, there are shown some example embodiments.

Figure 1:
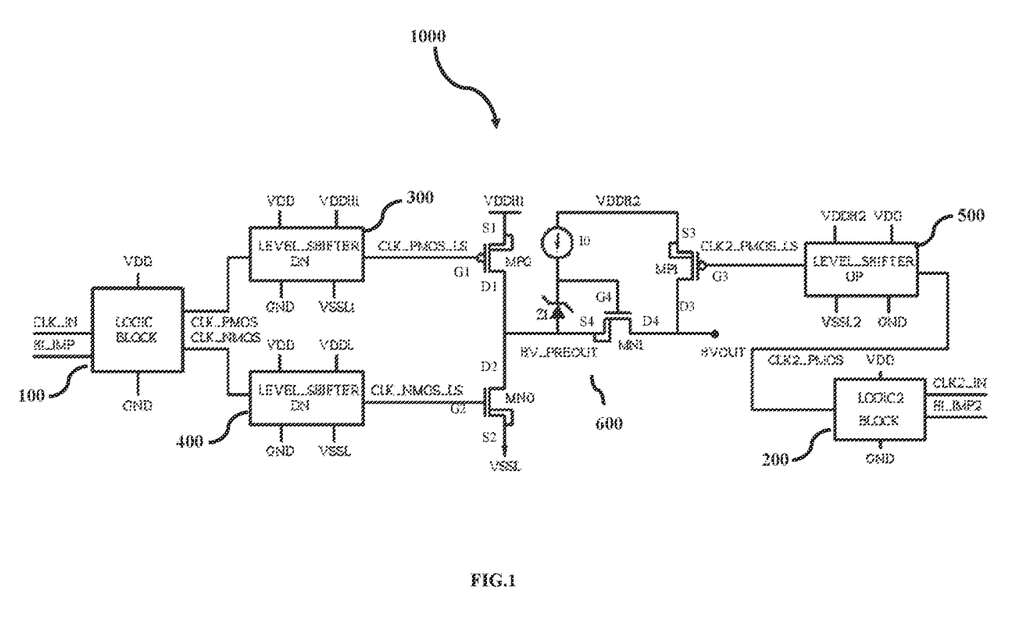
FIG. 1 is a circuit diagram of an apparatus configured to drive and/or generate a multi-signaling high voltage output, according to at least one example embodiment.

FIG. 1 is a schematic diagram of a voltage driver apparatus (1000) for driving and/or generating multi-signalling high voltage output, according to at least one example embodiment. In other words, the apparatus (1000) acts as a voltage driver.

In at least one example embodiment, the apparatus (1000) comprises a first logic block (100) (e.g., first logic circuitry), a second logic block (200) (e.g., second logic circuitry), a first down level shifter (300) (e.g., a first voltage down level shifter circuitry), a second down level shifter (400) (e.g., a second voltage down level shifter circuitry), a first up level shifter (500) (e.g., a first voltage up level shifter circuitry), and/or an output buffer (600), but the example embodiments are not limited thereto, and for example, may include a greater or lesser number of constituent elements, such as a single logic block, and/or a single down level shifter, etc., or three or more logic blocks, three or more down level shifters, two or more up level shifters, and/or two or more output buffers, etc., and/or different constituent elements, etc.

The first logic block (100) provides at least one input to the first down level shifter (300) and/or the second down level shifter (400), etc. The second logic block (200) provides at least one input to the first up level shifter (500). The first down level shifter (300), the second down level shifter (400), and/or the first up level shifter (500) provide inputs to the output buffer (600).

In at least one example embodiment, a first input to the first logic block (100) is a clock input (CLK_IN), but is not limited thereto. The clock input (CLK_IN) is a low voltage domain clock source signal swinging between, e.g., 0 to VDD=3V, etc., generated by a clock generator (not shown). A second input to the first logic block (100) is another low voltage signal referred to as HI_IMP.

The first logic block (100) provides at least two low voltage domain clock signal outputs (e.g., CLK_PMOS and CLK_NMOS). The output CLK_PMOS is provided as an input to the first down level shifter (300), and the output CLK_NMOS is provided as an input to the second down level shifter (400), but the example embodiments are not limited thereto. As shown in table 1 below, when the input signal HI_IMP to the first logic block (100) is equal to VDD, then the output CLK_PMOS is equal to VDD, and the output CLK_NMOS is equal to ground (GND), but is not limited thereto. Further when the input signal HI_IMP to the first logic block (100) is equal to GND, then the output CLK_PMOS and the output CLK_NMOS is based on the input CLK_IN to the first logic block (100), but is not limited thereto.

Similarly, a first input to the second logic block (200) is a clock input signal (e.g., CLK2_IN) and a second input to the second logic block (200) is another low voltage signal referred to as the HI_IMP2, but the example embodiments are not limited thereto. The clock input (e.g., CLK2_IN) is a low voltage domain clock source signal (e.g., VDD=3V, etc.) generated by a clock generator (not shown), but is not limited thereto. The second logic block (200) provides at least one low voltage domain clock output signal (e.g., CLK2_PMOS), etc. The output (e.g., CLK2_PMOS) is provided as an input to the first up level shifter (500), but is not limited thereto.

As shown in table 1 below, when the input HI_IMP2 to the second logic block (200) is equal to VDD, then the output (e.g., CLK2_PMOS) is equal to VDD. Further when the input HI_IMP2 to the second logic block (200) is equal to GND, then the output (e.g., CLK2_PMOS) is based on the input CLK2_IN to the second logic block (200), but the example embodiments are not limited thereto.

TABLE 1

| Parameter | Output |
|---|---|
| HI_IMP = VDD | CLK_PMOS = VDD, CLK_NMOS = GND |
| HI_IMP = GND | CLK_PMOS, CLK_NMOS derived from CLK_IN |
| HI_IMP2 = VDD | CLK2_PMOS = VDD |
| HI_IMP2 = GND | CLK2_PMOS = CLK2_IN |

The first down level shifter (300), after receiving the CLK_PMOS signal as an input, level shifts the CLK_PMOS signal to an output signal CLK_PMOS_LS, wherein the signal CLK_PMOS swings between VDD to GND, and the output signal CLK_PMOS_LS swings between a first supply voltage (e.g., VDDH1) and a first reference voltage (e.g., VSSL1), etc. Additionally, the output of the first down level shifter (300) CLK_PMOS_LS is provided as an input to the output buffer (600), etc.

Similarly, the second down level shifter (400), after receiving the CLK_NMOS signal as an input, level shifts the CLK_NMOS signal to an output signal CLK_NMOS_LS, wherein the signal CLK_NMOS swings between VDD to GND, and the signal CLK_NMOS_LS swings between a second reference voltage (e.g., VDDL) and a second supply voltage (e.g., VSSL), but is not limited thereto. Additionally, the output of the second down level shifter (400) CLK_NMOS_LS is provided as an input to the output buffer (600), etc.

Similarly, the first up level shifter (500), after receiving the CLK2_PMOS signal as an input, level shifts the CLK2_PMOS signal to an output signal CLK2_PMOS_LS, wherein the signal CLK2_PMOS swings between VDD to GND, and the signal CLK2_PMOS_LS swings between a third supply voltage (e.g., VDDH2) and a third reference voltage (e.g., VSSL2), but is not limited thereto. The output of the first up level shifter (500) (e.g., CLK2_PMOS_LS) is provided as an input to the output buffer (600), but is not limited thereto.

In at least one example embodiment, the output buffer (600) combines the output of the first down level shifter (300) (e.g., CLK_PMOS_LS), the output of the second down level shifter (400) (e.g., CLK_NMOS_LS), and the output of the first up level shifter (500) (e.g., CLK2_PMOS_LS) to generate a desired output (e.g., HVOUT), but the example embodiments are not limited thereto.

In at least one example embodiment, the signal HI_IMP of the first logic block (100) is used to set an intermediate output node HV_PREOUT to a high impedance state, and thereby disconnect both the first supply voltage (e.g., VDDH1) as well as the second supply voltage (e.g., VSSL) from the output. The clock input signal (e.g., CLK_IN) is used to connect (and/or select) either of the first supply voltage (e.g., VDDH1) or the second supply voltage (e.g., VSSL) to the output (e.g., HVOUT), when the input signal HI_IMP is low. Hence, the low voltage domain clock input (e.g., CLK_IN), swinging between GND to VDD, is level shifted to a high voltage domain swinging between VDDH1 to VSSL at the output, when the input signal HI_IMP is low. For a tristate output driver, the input signal HI_IMP can be independently defined (e.g., independently set and/or selected, etc.) and/or could be set as the complement of clock source CLK2_IN, but the example embodiments are not limited thereto.

In at least one example embodiment, the clock input signal (e.g., CLK2_IN) to the second logic block (200) is used to connect or disconnect the third supply voltage (e.g., VDDH2) to the output (e.g., HVOUT). The input signal HI_IMP2 is used to disconnect the third supply voltage (e.g., VDDH2) from the output. For a tristate output driver, the input signal HI_IMP2 can be defined as the complement of HI_IMP signal or may be permanently set to GND, but the example embodiments are not limited thereto. For example, according to some example embodiments, the design may be extended to a four state output buffer, and the input signal HI_IMP2 could be set as the complement of a third clock source CLK3_IN, etc.

In at least one example embodiment, the output buffer (600) comprises a set (e.g., a plurality of) of P-type Metal Oxide Semiconductors (PMOS) transistors, a set of N-type Metal Oxide Semiconductors (NMOS) transistors, and/or a Zener Diode (Z1), etc., but the example embodiments are not limited thereto. The Zener diode comprises a negative terminal (−Z1) also referred to as a cathode, and a positive terminal (−Z2), also referred to as an anode.

The set of PMOS transistors comprises a plurality of PMOS transistors, such as a first PMOS transistor (MP0) and a second PMOS transistor (MP1), etc., but is not limited thereto. The first PMOS transistor (MP0) comprises a source (51), a drain (D1), a gate (G1) and a bulk (B1) (not shown in the FIG. 1). The source (51) of the first PMOS transistor (MP0) is connected to a first supply voltage (VDDH1), and the gate (G1) receives an input CLK_PMOS_LS from the first down level shifter (300), but are not limited thereto. The source (51) of the first PMOS transistor (MP0) is tied to the bulk (B1) of the first PMOS transistor (MP0), etc.

The second PMOS transistor (MP1) also comprises a source (S3), a drain (D3), a gate (G3) and a bulk (B3) (not shown in the FIG. 1). The gate (G3) of the second PMOS transistor (MP1) receives an input signal CLK2_PMOS_LS from the first up level shifter (500), etc. The source (S3) of second PMOS transistor (MP1) is tied to the bulk (B3) of second PMOS transistor (MP1), etc. The source (S3) of second PMOS transistor (MP1) is connected to a third supply voltage (VDDH2), etc.

The set of NMOS transistors comprises a plurality of NMOS transistors, such as a first NMOS transistor (MN0) and a second NMOS transistor (MN1), but is not limited thereto. The first NMOS transistor (MN0) comprises a source (S2), a drain (D2), a gate (G2) and a bulk (B2) (not shown in the FIG. 1). The source (S2) of the first NMOS transistor (MN0) is connected to a second supply voltage signal (VSSL), and the gate (G2) receives an input signal CLK_NMOS_LS from the second down level shifter (400), but are not limited thereto. The second NMOS transistor (MN1) also comprises a source (S4), a drain (D4), a gate (G4) and a bulk (B4) (not shown in the FIG. 1). The source (S2) of the first NMOS transistor (MN0) is tied to the bulk (B2) of the first NMOS transistor (MN0). The second NMOS transistor (MN1) acts as an isolation transistor between the first supply voltage (VDDH1) and the third supply voltage (VDDH2), and decreases and/or prevents current flow between the first supply voltage (VDDH1) and the third supply voltage (VDDH2) due to forward biasing of a drain-to-body diode of the first PMOS transistor (MP1) when output is at the third supply voltage (VDDH2) (e.g., VDDH2>VDDH1), but the example embodiments are not limited thereto.

In at least one example embodiment, the drain (D1) of the first PMOS transistor (MP0) is connected to the drain (D2) of the first NMOS transistor (MN0) from the set of NMOS transistors, but is not limited thereto. The source (S4) of the second NMOS transistor (MN1) is connected to the drain (D2) of the first NMOS transistor (MN0) and to the drain (D1) of the first PMOS transistor (MP0). The source (S3) of the second PMOS transistor (MP1) is connected to the second supply voltage (VDDH2), and the drain (D3) of the second PMOS transistor (MP1) is connected to the drain (D4) of the second NMOS transistor (MN1), etc. The source (S4) of the second PMOS transistor (MP1) is tied to the bulk (B4) of second PMOS transistor (MP1), etc.

The negative terminal (−Z1) of the Zener diode (Z1) is connected to the gate (G4) of the second NMOS transistor (MN1), and the positive terminal (+Z1) of the Zener diode (Z1) is connected to the source (S4) of the second NMOS transistor (MN1), but are not limited thereto. Further, the negative terminal (−Z1) of the Zener diode (Z1) is also connected to the third supply voltage (VDDH2), through a switchable current source (I0), such that when the current source (I0) is OFF the negative terminal −Z1 and the positive terminal +Z1 are at the same potential (e.g., the same voltage potential, etc.). When the current source (I0) is ON, the negative terminal (−Z1) and the positive terminal (+Z1) are separated by a reverse bias Zener breakdown voltage. The positive terminal (+Z1) of the Zener diode (Z1) is also connected to the drain of the first PMOS transistor (MP0) and the drain of the first NMOS transistor (MN0), but is not limited thereto.

In at least one example embodiment, the output from the drain (D1) of the first PMOS transistor (MP0), and the output from the drain (D2) of the first NMOS transistor (MN0), are referred to as an intermediate output signal (HV_PREOUT).

In at least one example embodiment, the output buffer (600) provides a final output signal (HVOUT). The output signal (HVOUT) produces at least three different voltage levels. For example, the three different voltage levels (e.g., the desired voltage levels, etc.) illustrated in FIG. 1 are the first supply voltage (VDDH1), the second supply voltage (VSSL), and the third supply voltage (VDDH2), but the example embodiments are not limited thereto. The different voltage levels may vary such that VSSL<VDDH1<VDDH2, but the example embodiments are not limited thereto. In at least one example embodiment the sample values for the first supply voltage (VDDH1), the second supply voltage (VSSL), and the third supply voltage (VDDH2) are, e.g., GND, −20V and 20V, but the example embodiments are not limited thereto. For example, the design may be extended for even higher voltage ranges by the use of proper type of LDMOS transistors, etc.

In at least one example embodiment, when the first NMOS transistor (MN0) and the second PMOS transistor (MP1) are in the non-operating state, and the second NMOS transistor (MN1) and the first PMOS transistor (MP0) are in the operating state, then the output (HVOUT) is equal to the first supply voltage (VDDH1), but is not limited thereto.

In at least one example embodiment, when the first PMOS transistor (MP0) and the second PMOS transistor (MP1) are in the non-operating state, and the second NMOS transistor (MN1) and the first NMOS transistor (MN0) are in the operating state, then the output (HVOUT) is equal to the second supply voltage (VSSL), but is not limited thereto.

In at least one example embodiment, when the second NMOS transistor (MN1), the first PMOS transistor (MP0) and the first NMOS transistor (MN0) are in the non-operating state, and the second PMOS transistor (MP1) is in the operating state, then the output (HVOUT) is equal to the third supply voltage (VDDH2), but is not limited thereto.

The voltage driver according to at least one example embodiment provides at least three different levels of voltage output (e.g., 20V, 0, −20V) without consuming and/or using any forward body-diode, and/or without consuming and/or using any crowbar current using thin gate oxide LDMOS transistors. In the voltage driver of at least one example embodiment, isolation is provided between different pull-up paths such that the forward biasing of body diodes is decreased and/or completely avoided. The voltage driver according to at least one example embodiment is further extended to generate n different levels in a cost effective manner.

Figure 2:
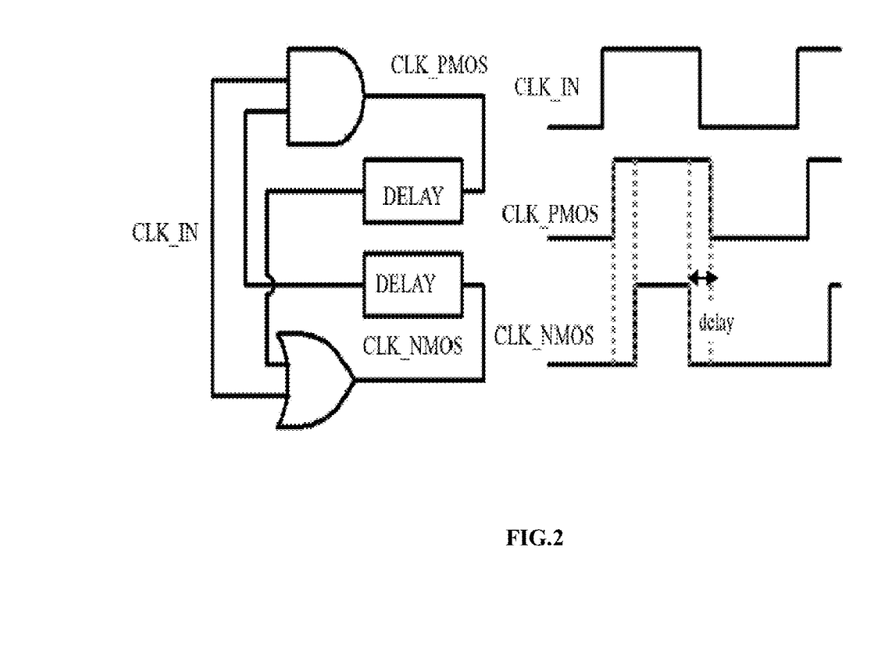
FIG. 2 is a timing diagram illustrating input and output waveforms of the first logic block, according to at least one example embodiment.

FIG. 2 is a timing diagram, illustrating input and output waveforms for the first logic block (100), according to at least one example embodiment.

As discussed, the first logic block (100) receives at least two input signals and produces at least two output signals, but is not limited thereto. The first input to the first logic block (100) is the clock input signal (CLK_IN) and the second input to the first logic block (100) is the signal referred to as HI_IMP, but the example embodiments are not limited thereto. The first input (CLK_IN) and the second input are in a low voltage, such as a digital supply VDD (e.g. VDD=1.8V) domain, etc. The first logic block (100) generates at least two low voltage domain clock outputs CLK_PMOS and CLK_NMOS, but is not limited thereto.

As seen in FIG. 2, the second input signal (HI_IMP) is at ground and the low voltage domain clock signal outputs CLK_PMOS and CLK_NMOS based on the first clock input signal (CLK_IN). Further as seen in FIG. 2, a delay may be introduced, but the example embodiments are not limited thereto. According to at least one example embodiment, a delay is introduced as an edge dependent skew such that there is no and/or a reduced crowbar current between the first supply voltage (VDDH1) and the second supply voltage (VSSL), and wherein the skew is introduced such that a rising edge of CLK_NMOS is delayed from the rising edge of CLK_PMOS, and the falling edge of CLK_PMOS is delayed from the falling edge of CLK_NMOS. In at least one example embodiment, the delay is 3 ns, but the example embodiments are not limited thereto. The rising edge of CLK_PMOS and falling edge of CLK_NMOS follow the rising and falling edges of CLK_IN respectively.

The output signal CLK_PMOS is provided as an input to the first down level shifter (300), and the output signal CLK_NMOS is provided as an input to the second down level shifter (400), but the example embodiments are not limited thereto.

In at least one example embodiment, the first logic block (100) is responsible for setting the intermediate output (HV_PREOUT) in a high impedance mode, when the output signal is at VDDH2. The first logic block (100) sets the output signals CLK_PMOS and CLK_NMOS at high and low, respectively. This is done, for example, by using digital combinational logic circuitry which monitors the status of HI_IMP pin (e.g., determines whether HI_IMP=VDD, etc.) to the first logic block (100), but the example embodiments are not limited thereto.

In at least one example embodiment, the edge dependent skew generated in the first logic block (100), decreases and/or prevents the flow of crowbar current between the first PMOS transistor (MP0) and the first NMOS transistor (MN0). The first PMOS transistor (MP0) and the first NMOS transistor (MN0) consume huge switching currents because they are designed to drive high capacitive loads. Any crowbar current between the output supplies will degrade the power efficiency of the circuit, and therefore significantly increases the overall power consumption of the chip.

When the first input to the first logic block (100) is GND (e.g., HI_IMP=GND), then the output signals CLK_PMOS and CLK_NMOS are derived from the other input, e.g., CLK_IN.

The first input to the second logic block (200) is the clock input signal (CLK2_IN) and the second input to the second logic block (200) is the signal HI_IMP2. The first input signal (CLK2_IN) is in low voltage domain, e.g., digital supply VDD (e.g. VDD=1.8V), but is not limited thereto. The second logic block (200) provides a low voltage domain clock output CLK2_PMOS, etc.

In at least one example embodiment, the second logic block (200) is used to switch ON/OFF (e.g., toggle) the second PMOS transistor (MP1) of the output buffer (600). The second PMOS transistor (MP1) is turned OFF by using digital combinational logic circuitry which monitors the status of the input HI_IMP2 (e.g., determine whether HI_IMP2=VDD), but the example embodiments are not limited thereto.

Figure 3A:
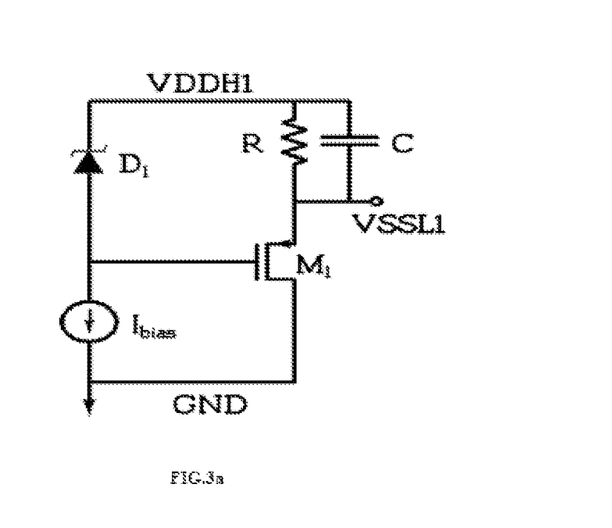
FIGS. 3a and 3b are schematic diagrams, illustrating generation of a first reference voltage (VSSL1) and a second reference voltage (VDDL), according to some example embodiments.
Figure 3B:
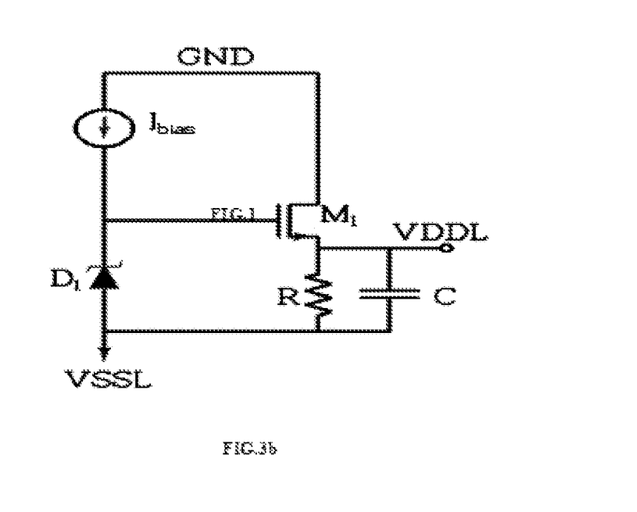

FIGS. 3a and 3b are schematic diagrams, illustrating the generation of the first reference voltage (VSSL1) and the second reference voltage (VDDL), according to some example embodiments.

According to at least one example embodiment, the first reference voltage (VSSL1) for the first down level shifter (300), the second reference voltage (VDDL) for the second down level shifter (400), and the third reference voltage (VSSL2) for the first down level shifter (500), are internally generated, but the example embodiments are not limited thereto.

As shown on FIG. 3a, the first reference voltage (VSSL1) for the first down level shifter (300) is generated from the first supply voltage (VDDH1) using a reverse breakdown Zener diode (D1), but is not limited thereto. The first reference voltage (VSSL1) is generated using the first supply voltage (VDDH1), such that first reference voltage (VSSL1) tracks the first supply voltage (VDDH1) with maximum difference of, for example, 6V, etc., as explained in equation 1, but is not limited thereto. The reverse biased Zener diode (D1) is used to drop the first supply voltage (VDDH1) by, e.g., 6.6 V, at a gate of a LDMOS transistor M1, which is shifted up by the threshold voltage of M1 transistor to generate VSSL1, but the example embodiments are not limited thereto and different desired voltages may be used.

$$VDDH1-VSSL1<=6V \quad \text{[Equation 1]}$$

As shown on FIG. 3b, the second reference voltage (VDDL) for the second down level shifter (400) is generated from the second supply voltage (VSSL) using the reverse breakdown Zener diode (D1), but is not limited thereto. The second reference voltage (VDDL) is generated using the second supply voltage (VSSL), such that second reference voltage VDDL tracks the second supply voltage (VSSL) with a maximum difference of, for example 6V, etc., as explained in equation 2, but the example embodiments are not limited thereto. The reverse biased Zener diode (D1) is used to increase the second supply voltage (VSSL) by, for example, 6.6 V, etc., at the gate of M1, which is shifted down by the threshold voltage of LDMOS transistor to generate VDDL, but the example embodiments are not limited thereto and other desired voltages may be used.

$$VDDL-VSSL<=6V \quad \text{[Equation 2]}$$

Similarly the third reference voltage (VSSL2) is generated from the third supply voltage (VDDH2). The third reference voltage (VSSL2) is generated using the supply VDDH2, such that it quickly tracks VDDH2 with the maximum difference of, e.g., 6V, etc., as shown in equation 3, but the example embodiments are not limited thereto. The reverse biased Zener diode is used drop the supply voltage VDDH2 by, e.g., 6.6 V, etc., which is shifted up by the threshold voltage of LDMOS transistor to generate VSSL2, but the example embodiments are not limited thereto and other desired voltages may be used.

$$VDDH2-VSSL2<=6 V \quad \text{[Equation 3]}$$

Figure 4A:
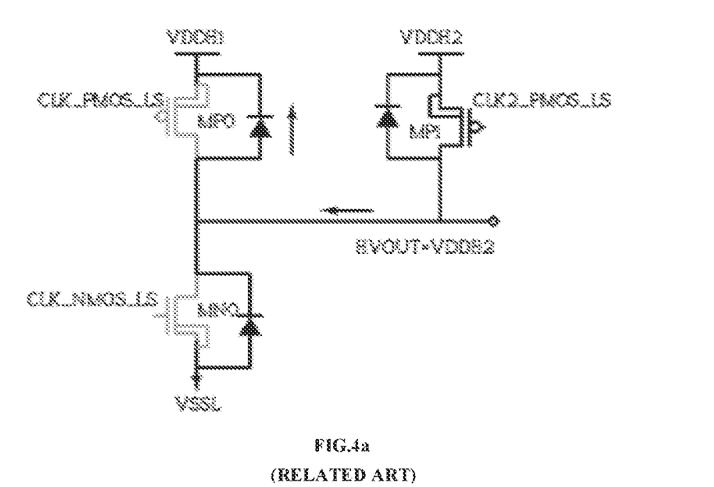
FIG. 4a is a schematic diagram illustrating flow of current between a third supply voltage (VDDH2) and a first supply voltage (VDDH1), according to the related art.

FIG. 4a is a schematic diagram, illustrating a flow of current between the third supply voltage (VDDH2) and the first supply voltage (VDDH1) in the absence of the second NMOS transistor (NM1) according to the related art. In the circuit of FIG. 4a, for the output HVOUT to be equal to the third supply voltage (VDDH2), the first PMOS transistor (MP0), the first NMOS transistor (MN0) must be OFF, and only the second PMOS transistor (MP1) may be allowed to conduct. However, with this circuit, the body diode of first PMOS transistor (MP0) becomes forward biased because VDDH2>VDDH1. This leads to comparatively large power consumption between the third supply voltage (VDDH2) and the first supply voltage (VDDH1), resulting in hot-spots. Current flow through the body diode also results in latch-up, and therefore may damage the whole chip, etc.

Figure 4B:
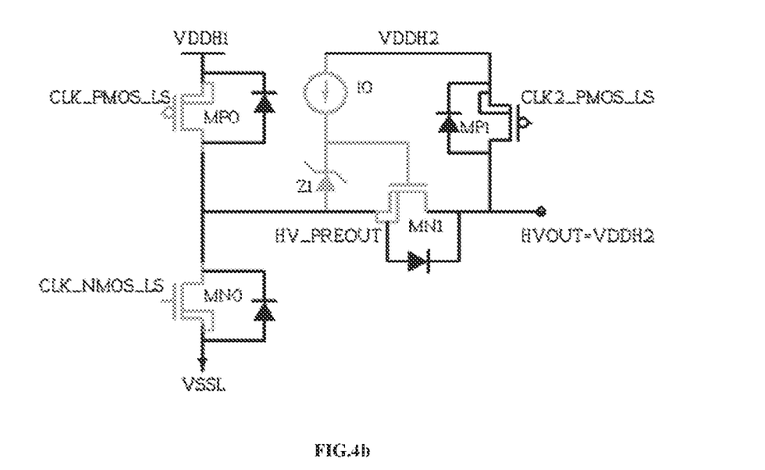
FIG. 4b is a schematic diagram, illustrating flow of current between the third supply voltage (VDDH2) and the first supply voltage (VDDH1) reduced and/or prevented by use of a second NMOS transistor (MN1), according to at least one example embodiment.

FIG. 4b is a schematic diagram illustrating a flow of current between the second supply voltage (VDDH2) and the first supply voltage (VDDH1) restricted by the second NMOS transistor (NM1), according to at least one example embodiment. In at least one example embodiment, for the output HVOUT to be equal to the second supply voltage (VDDH2), the first PMOS transistor (MP0), the first NMOS transistor (MN0) and the second NMOS transistor (MN1) are turned OFF, and only the second PMOS transistor (MP1) is conducting. The body diode of the second NMOS transistor (MN1) then becomes reverse biased, and therefore the flow of current between the third supply voltage (VDDH2) and the first supply voltage (VDDH1) is reduced and/or prevented.

Figure 5:
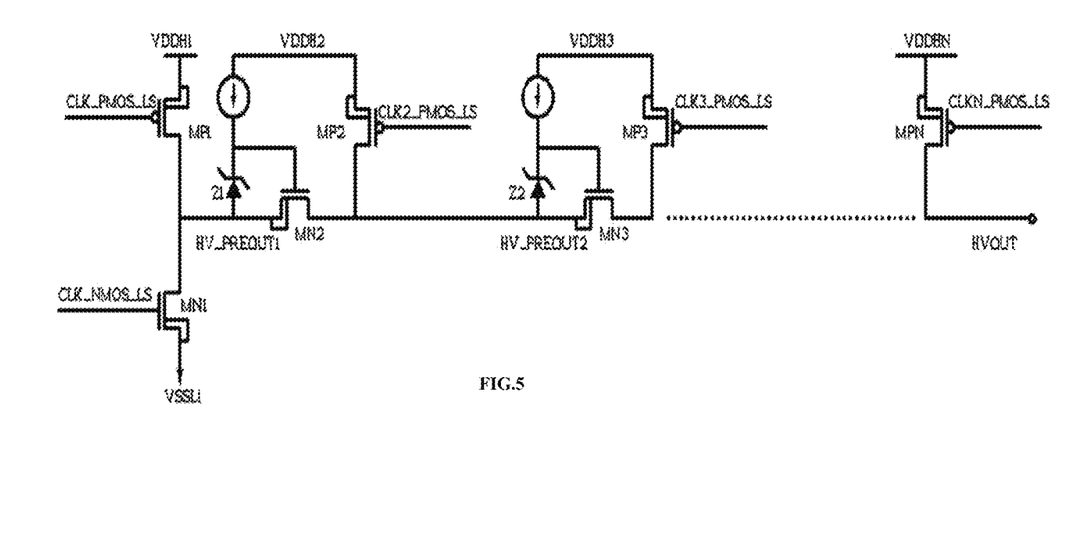
FIG. 5 is a schematic diagram, illustrating multiple level output driver using the apparatus, according to at least one example embodiment.

FIG. 5 is a schematic diagram illustrating generation of HVOUT with N levels such that VDDHN>VDDHN−1>VSSL according to at least one example embodiment, wherein N is a natural number. As shown in FIG. 5, according to at least one example embodiment, the signals CLK_PMOS_LS, CLK2_PMOS_LS, CLK3_PMOS_LS and CLKN_PMOS_LS, etc., are N non-overlapping clock signals, in their respective voltage domains. No two of these clock signals go low at the same time. Further, none of the CLK_PMOS_LS, CLK2_NMOS_LS, CLK3_PMOS_LS and CLKN_PMOS_LS go low when CLK_NMOS_LS is high. Thus, we can achieve the desired HVOUT having N output levels without the flow of any crowbar current and body diode current between the supply voltages.

Referring to FIG. 5, if the voltage supplies are such that VDDH1<VDDH2< . . . <VDDHN, in that case, the plurality of NMOS devices (e.g., MN2, MN3 MNn, etc.) provide isolation between VDDHx supplies, along with the plurality of PMOS devices (e.g., MP2, MP3, MPn, etc.). In at least one example embodiment, node HV_PREOUT2 may be at VDDH1 or VDDH2 or VSSL, by using combinations of MP1, MP2, MN1, and MN2, etc., as explained above. If the NMOS device (MN3) is ON and the PMOS device (MP3) is OFF, HV_PREOUT3 can be driven by VDDH1, VDDH2, or VSSL, but is not limited thereto. But, there is no current path between HV_PREOUT3 and VDDH3 when MP3 is off in this situation. If the NMOS device (MN3) is OFF and the PMOS device (MP3) is ON, HV_PREOUT3 is connected to VDDH3, but MN3 is isolating VDDH1, VDDH2, and VSSL from VDDH3. Therefore, according to at least one example embodiment, due to the increasing order of supplies, it is ensured that drain-body diode of all PMOS (MP2, MP3, . . . MPN) are always reverse biased when respective PMOS devices are OFF. Similarly, according to at least one example embodiment, it is ensured that the drain body diode of all NMOS devices (MN2, MN3 . . . MNN) are always reverse biased when respective NMOS devices are OFF.

Various example embodiments are disclosed herein which may be implemented using at least one logical circuit running on at least one hardware device, and performing management functions to control the at least one logical circuit in the apparatus (1000), but the example embodiments are not limited thereto.

The foregoing description of various example embodiments will so fully reveal the principles of the inventive concepts, so that a person of ordinary skill in the art may readily modify and/or adapt for various applications one or more example embodiments without departing from the principles of the inventive concepts, and, therefore, such adaptations and modifications should and are intended to be comprehended within the meaning and range of equivalents of the disclosed example embodiments. It is to be understood that the phraseology or terminology employed herein is for the purpose of description only and are not of limitation. Therefore, while some example embodiments herein have been described herein, those of ordinary skill in the art will recognize that the example embodiments herein can be practiced with modification within the spirit and scope of the inventive concepts as described herein.

We claim:

1. An apparatus for generating multi-signaling output voltages, comprising:
   at least one output buffer including,
   a plurality of p-type metal-oxide-semiconductor (PMOS) transistors, each PMOS transistor of the plurality of PMOS transistors including a source, a drain and a gate;
   a plurality of n-type metal-oxide-semiconductor (NMOS) transistors, each NMOS transistor of the plurality of NMOS transistors including a source, a drain and a gate;
   a first PMOS transistor from the plurality of PMOS transistors, the drain of the first PMOS transistor being connected to a drain of a first NMOS transistor from the plurality of NMOS transistors;
   a second NMOS transistor from the plurality of NMOS transistors, the source of the second NMOS transistor being connected to the drain of the first NMOS transistor and the drain of the first PMOS transistor;
   a second PMOS transistor from the plurality of PMOS transistors, the source of the second PMOS transistor (MP1) being connected to a third supply voltage, and the drain of the second PMOS transistor being connected to the drain of the second NMOS transistor; and
   a reversed Zener diode including a positive terminal and a negative terminal, the negative terminal being connected to the gate of the second NMOS transistor and the third supply voltage through a switchable current source, the positive terminal being connected to the source of the second NMOS transistor, the drain of the first PMOS transistor, and the drain of the first NMOS transistor.

2. The apparatus as claimed in claim 1, wherein the at least one output buffer is configured to:
   output a first supply voltage, in response to the first NMOS transistor and the second PMOS transistor being in a non-operating state, and the second NMOS transistor and the first PMOS transistor being in an operating state;
   output a second supply voltage, in response to the first PMOS transistor and the second PMOS transistor being in the non-operating state, and the first NMOS transistor and the second NMOS transistor being in the operating state; and
   output the third supply voltage, in response to the second NMOS transistor, the first PMOS transistor, and the first NMOS transistor being in the non-operating state, and the second PMOS transistor being in the operating state.

3. The apparatus as claimed in claim 1, wherein the apparatus further comprises:
   first logic circuitry, second logic circuitry, first voltage down level shifter circuitry, second voltage down level shifter circuitry, and first voltage up level shifter circuitry.

4. The apparatus as claimed in claim 3, wherein the first logic circuitry is configured to:
   provide an input signal to the first voltage down level shifter circuitry; and
   provide an input signal to the second voltage down level shifter circuitry.

5. The apparatus as claimed in claim 3, wherein the second logic circuitry is configured to:
   provide an input signal to the first voltage up level shifter circuitry.

6. The apparatus as claimed in claim 3, wherein the first logic circuitry is configured to:
   introduce an edge dependent skew between an input to the first voltage down level shifter circuitry and an input to the second voltage down level shifter circuitry such that there is no crowbar current between a first supply voltage and a second supply voltage.

7. The apparatus as claimed in claim 3, wherein the first voltage down level shifter circuitry is configured to:
   provide an input signal to the gate of the first PMOS transistor.

8. The apparatus as claimed in claim 3, wherein the second voltage down level shifter circuitry is configured to:
   provide an input signal to the gate of the first NMOS transistor.

9. The apparatus as claimed in claim 3, wherein the first voltage up level shifter circuitry is configured to:
   provide an input signal to the gate of the second PMOS transistor.

10. The apparatus as claimed in claim 1, wherein for each transistor of the plurality of PMOS transistors and the plurality of NMOS transistors, a bulk and the source are connected.

11. The apparatus as claimed in claim 1, wherein the second NMOS transistor is configured to:
   act as an isolation transistor to reduce current flow between a first supply voltage and the third supply voltage.

12. The apparatus as claimed in claim 1, wherein the plurality of PMOS transistors and the plurality of NMOS transistors are thin oxide laterally-diffused metal-oxide semiconductor (LDMOS) transistors.

13. The apparatus as claimed in claim 1, wherein the reversed Zener diode is configured to:
   internally generate a first reference voltage for the first voltage down level shifter circuitry, a second reference voltage for the second voltage down level shifter circuitry, and a third reference voltage for the first voltage up level shifter circuitry.

14. The apparatus as claimed in claim 1, wherein the at least one output buffer is configured to generate an N level output voltage, wherein N is a natural number.

15. A method for generating multi-signaling output voltages, comprising:
   setting an output voltage of at least one output buffer included in an apparatus to a first supply voltage, in response to a first NMOS transistor of a plurality of NMOS transistors of the apparatus and a second PMOS transistor of a plurality of PMOS transistors of the apparatus being in a non-operating state, and a second NMOS transistor of the plurality of NMOS transistors and a first PMOS transistor of the plurality of PMOS transistors being in an operating state;
   setting the output voltage to a second supply voltage, in response to the first PMOS transistor and the second PMOS transistor being in the non-operating state, and the first NMOS transistor and the second NMOS transistor being in the operating state;
   setting the output voltage to a third supply voltage, in response to the second NMOS transistor, the first PMOS transistor and the first NMOS transistor being in the non-operating state, and the second PMOS transistor being in the operating state; and
   reducing current flow between the first supply voltage and the third supply voltage using the second NMOS transistor, wherein the second NMOS transistor acts as an isolation transistor.

16. The method as claimed in claim 15, further comprising:
   generating a first reference voltage based on the first supply voltage using a reverse biased Zener diode; and
   providing the first reference voltage to a first voltage down level shifter circuitry.

17. The method as claimed in claim 15, further comprising:
   generating a second reference voltage based on the second supply voltage using a reverse biased Zener diode; and
   providing the second reference voltage to a second voltage down level shifter circuitry.

18. The method as claimed in claim 15, further comprising:
   generating a third reference voltage based on the second supply voltage.

19. The method as claimed in claim 15, further comprising:
   generating an N level output voltage using the at least one output buffer, wherein N is a natural number.

20. The method as claimed in claim 15, further comprising:
   providing isolation between different pull-up paths using the second NMOS transistor.

* * * * *